May 19, 1970 C. B. LEWIS 3,512,249
PRESSURE CONTACT SEMICONDUCTOR DEVICES
Filed Aug. 22, 1967
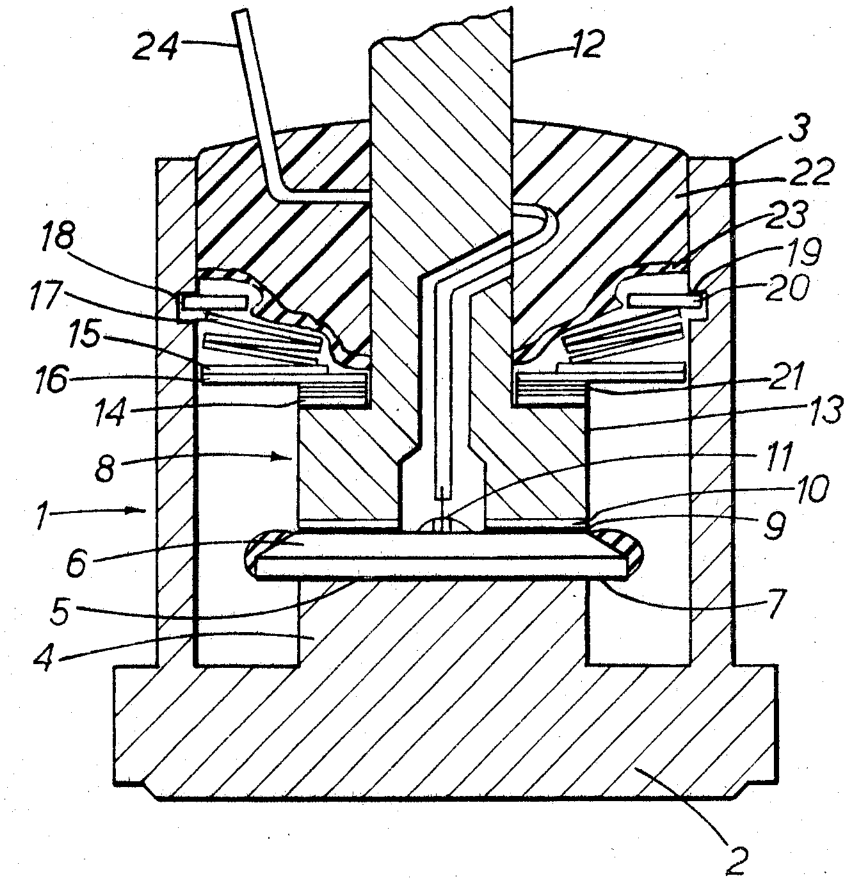

United States Patent Office 3,512,249
Patented May 19, 1970

3,512,249

PRESSURE CONTACT SEMICONDUCTOR DEVICES

Colin Bright Lewis, Nettleham, England, assignor to Associated Electrical Industries Limited, London, England, a British company Filed Aug. 22, 1967, Ser. No. 662,519
Claims priority, application Great Britain, Nov. 11, 1966, 50,693/66
Int. Cl. H01l 1/14, 5/02; B01j 17/00
U.S. Cl. 29—588 4 Claims

ABSTRACT OF THE DISCLOSURE

A method of assembling a semiconductor device includes the steps of determining the height of a stack including a semiconductor element, part of a conductive terminal, spring means and retaining means, and increasing the height of the stack, if necessary, by the addition of at least one shim so that, when the stack is arranged on a support surface provided by a conductive base member of a housing and when the height of the stack is reduced sufficiently by compressing the spring means to allow the retaining means to engage an abutment surface on a wall of the housing surrounding the support surface, the contact pressures upon the element are within a required range of values.

BACKGROUND OF THE INVENTION

This invention relates to semiconductor devices in which an element comprising a wafer of semiconducting material having at least one junction therein between regions of the wafer of different conductivity or conductivity type and a pair of surface electrodes one on each of the opposite faces of the wafer is held solely by spring pressure between a pair of conductive members with the electrodes on the element in electrical contact with the respective member.

For satisfactory operation of pressure contact semiconductor devices it is necessary that the contact pressure between the element and each conductive member lies within a certain range of values. Pressures in the range 2000 p.s.i. to 2900 p.s.i. have been found to be most suitable. The spring pressure is adjusted by varying the degree of compression of the spring during the assembly of the device and with such devices it is known for the spring to be compressed by an external force and spring retaining means brought into engagement with the spring to retain the spring in compression. It is also known for the retaining means to have a threaded portion which engages with a mating threaded portion on a fixed part of the device to enable the spring pressure to be varied by screwing the retaining means towards or away from the fixed part of the device.

SUMMARY OF THE INVENTION

It is an object of the present invention to provide a method of assembling a pressure contact semiconductor device which is relatively simple and ensures that the contact pressure between the element and the conductive members of the assembled device is within acceptable limits.

According to the present invention a method of assembling a semiconductor device includes the steps of: determining the height of a stack including a semiconductor element, part of a conductive terminal, spring means and retaining means; increasing the height of the stack if necessary by the addition of at least one shim to the stack between the retaining means and the element so that, when the stack is arranged on a support surface provided by a conductive base member of a housing for the device with a pair of electrodes on opposite face of the element in electrical contact with the support surface and the part of the terminal respectively, and when the height of the stack is reduced sufficiently by compressing said spring means to allow the retaining means to engage an abutment surface on a wall of the housing surrounding the support surface, the contact pressures between the element and both the support surface and the conductive terminal are within a required range of values; arranging the stack on said support surface; compressing the spring means to reduce the height of the stack; and causing the retaining means to engage said abutment surface to retain the spring means in compression .

The spring means which forms part of the stack conveniently comprises a plurality of Schnorr type springs, the deflection of which with load is substantially linear and the invention depends on the fact that for a stack of any particular height there is a range of spring deflections which will produce contact pressure within the required range.

When the semiconductor device is a diode the element has one junction therein between regions of different conductivity or conductivity type and when the device is a thyristor the element is a PNPN structure. The element in each case may be, and usually is, mounted on a plate of a material such as molybdenum which has a similar thermal expansion coefficient to that of the semiconductor material.

BRIEF DESCRIPTION OF THE DRAWING

In order that the invention may be more readily understood it will now be described, by way of example, with reference to the accompanying drawing which is a section through a thyristor.

DESCRIPTION OF THE PREFERRED EMBODIMENT

A thyristor comprises a conductive housing 1 conveniently of copper, having a base member 2 and a generally cylindrical wall 3 projecting from one surface thereof. The wall surrounds and is spaced from a pedestal 4 providing a generally flat support surface 5. A semiconductor element 6 comprising a PNPN wafer mounted on a molybdenum backing plate rests on the surface 5 with a gold foil 7 interposed between them. A surface electrode covers most of the surface area of the wafer which is in contact with the backing plate. On the opposite surface of the element an annular surface electrode (not shown) is in contact with an annular end face of a conductive terminal 8 through the intermediary of an annular gold foil 9, a molybdenum washer 10 and a further annular gold foil (not shown). A further electrode 11 is provided on the element centrally of the annular surface electrode and serves as the gate electrode of the thyristor.

The conductive terminal 8 has a stem 12 and an enlarged end portion 13 which provides the annular end face. Two plain steel washers 14 and 15 are stacked on the shoulder of the enlarged end portion with a mica washer 16 positioned between them. The washers help to centre the terminal 8 in the wall 3 of the housing. Three Schnorr springs 17 are mounted on the steel washer 15 and the purpose of the two steel washers is to spread and equalise the load on the enlarged end portion of the terminal 8 when the springs are compressed. Retaining means in the form of a circlip 18 is provided on the springs and the clip engages with an abutment surface 19 provided by a groove 20 in the wall 3 of the housing.

When the circlip is sprung into the groove 20 the compressive deflection of the springs will depend on the difference between (1) the height above the surface 5 of the stack consisting of foils 7, 9 and one other, element 6, molybdenum washer 10, the enlarged head portion 13 of the terminal, steel washers 14 and 15, mica washer 16, Schnorr springs 17 and the circlip 18 and (2) the height above the surface 5 of the surface 19 of the groove 20.

These quantities are all subject to manufacturing tolerances and it is clear that the maximum spring deflection will occur when all the items making up the stack have their maximum thickness and the height of the surface 19 above the surface 5 is its minimum. If the dimensions are so chosen that under these conditions the spring pressure is such as to give the maximum permissible contact pressure then it is possible to use a lower deflection and consequently lower contact pressure down to the minimum permissible value to take up the part of the possible variation due to tolerances, the remainder being taken up by adding shims to the stack.

If the range of permissible deflections is greater than the range of variation of the height of the surface 19 above the surface 5, the whole of this variation and part of the variation in the height of the stack can be taken up by the spring, consequently to assemble the device the actual height of the stack without shims is determined and if necessary one or more metal shims 21 are added to the stack between the washers 14 and 16 to bring the height within a specified amount of the maximum value. The stack is assembled on the support surface 5, the spring is compressed and th circlip fitted into the groove 20, the spring deflection and hence the contact pressure will then fall within the design limits.

As an example a thyristor will now be described in which the contact areas of the semiconductor element are such that the contact pressure limits of 2000 p.s.i. and 2900 p.s.i. correspond to spring loadings of 590 lbs. and 850 lbs. respectively.

Schnorr springs are available which, for a stack of 3 in series, has a deflection of .055" at 590 lbs. load and .088" at 850 lbs. load, i.e. an acceptable range of deflection of .033".

The dimensions and tolerances of the components forming the stack are as follows:

| | Inches |
|---|---|
| Gold foil **7** | .002±.001 |
| Element **6** | .056±.004 |
| Gold foil **9** | .002±.001 |
| Molybdenum washer **10** | .020±.002 |
| Gold foil (not shown) | .002±.001 |
| Emitter contact **13** | .150±.010 |
| Steel washer **14** | .040±.002 |
| Mica washer **16** | .030±.003 |
| Steel washer **15** | .040±.002 |
| 3 Schnorr springs (unloaded) **17** | .267±.009 |
| Circlip **18** | .047±.002 |
| | .656±.037 |

The maximum height of the stack is .693"
The maximum spring deflection is .088"

Therefore the minimum height of the circlip groove is .693"−.088"=.605".

Let the upper limit of the circlip groove be

.605"+.005"=.610"

(This is a reasonable manufacturing tolerance.)

Then with the circlip groove at its upper limit, the stack height to provide a spring stack deflection of .055" (minimum permissible) is .610"+.055"=.665". The spring can take up .028" tolerance below the maximum stack height. Therefore we must arrange to shim the stack height to within .028" of the upper limit, i.e. into the range .693"/.665".

The range of stack heights available is

.656"±.037"=.693"/.619"

From experience it has been found that most consistent results are obtained by shimming the stack to within .010" of the top limit of .693"/.683".

The required thickness may be built up by selecting 0 or 1 shim from a range having thicknesses of .070", .060", .050", .040", .030", .020", .010".

It is proposed to assemble the stack, less shim, on a jig and to measure the height by bringing a clock gauge into contact with the top of the stack.

The stack together with the shim, if required, is then re-assembled on the support surface 5, the spring compressed and the circlip sprung into the groove.

With a device assembled in the manner described above it is possible to provide encapsulation by filling the space within the wall 3 above the mica washer 16 with a suitable electrically insulating sealing compound 22. Since the wall and the terminal 12 can be of the same material (copper), no differential expansion occurs between them when the device is in use.

To avoid risk of the sealing compound running through and contaminating the semiconductor element, it is proposed to apply a coating 23, conveniently of silicone rubber to the spring and washers after assembly and after this has solidified, to fill up the remaining space with a sealing material such as Araldite (trademark). An inert filler may be added to the Araldite if required.

A conductor to the trigger electrode 11 may pass in insulating relation through a bore in the terminal 12, but alternatively an insulated wire 24 passes through a bore in the enlarged head portion 13 and is then brought through the side of the stem 12 and through the compound 22 as a flying lead.

I claim:

1. A method of assembling a semiconductor device including the steps of: determining the height of a stack including a semiconductor element, part of a conductive terminal, spring means and retaining means; increasing the height of the stack if necessary by the addition of at least one shim to the stack between the retaining means and the element so that, when the stack is arranged on a support surface provided by a conductive base member of a housing for the device with a pair of electrodes on opposite faces of the element in electrical contact with the support surface and the part of the terminal respectively, and when the height of the stack is reduced sufficiently by compressing said spring means to allow the retaining means to engage an abutment surface on a wall of the housing surrounding the support surface, the contact pressures between the element and both the support surface and the conductive terminal are within a required range of values; arranging the stack on said support surface; compressing the spring means to reduce the height of the stack; and causing the retaining means to engage said abutment surface to retain the spring means in compression.

2. A method as claimed in claim 1 wherein said contact pressures are in the range 2,000 to 2,900 pounds per square inch.

3. A method as claimed in claim 1 in which said part of the conductive terminal is an enlarged end portion of an elongate member, including the further step of sealing a body of electrically insulating sealing compound to the electrically conductive terminal and to said wall on the side of the abutment surface away from said support surface to hermetically seal the device.

4. A method as claimed in claim 3 including the further step of applying a layer of silicone rubber to the stack before applying the sealing compound, whereby the sealing compound is separated from the stack by the layer of silicone rubber.

References Cited

UNITED STATES PATENTS

| | | | |
|---|---|---|---|
| 3,337,781 | 8/1967 | Ferree | 317—234 |
| 3,358,196 | 12/1967 | Steinmetz et al. | 317—234 |

FOREIGN PATENTS

| | | |
|---|---|---|
| 1,484,506 | 5/1967 | France. |

JOHN HUCKERT, Primary Examiner

R. F. POLISSACK, Assistant Examiner

U.S. Cl. C.R.

29—589, 626, 628; 317—234, 235